United States Patent [19]

Angell

[11] 3,928,094

[45] Dec. 23, 1975

[54] METHOD OF ALIGNING A WAFER BENEATH A MASK AND SYSTEM THEREFOR AND WAFER HAVING A UNIQUE ALIGNMENT PATTERN

[75] Inventor: James B. Angell, Portola Valley, Calif.

[73] Assignee: Fairchild Camera and Instrument Corporation, Mountain View, Calif.

[22] Filed: Jan. 16, 1975

[21] Appl. No.: 541,463

[52] U.S. Cl. .................... 148/187; 29/578; 148/175
[51] Int. Cl.$^2$ .......................................... H01L 21/308
[58] Field of Search ............... 148/187, 175; 29/578

[56] References Cited

UNITED STATES PATENTS

| | | | |
|---|---|---|---|
| 3,379,584 | 4/1968 | Bean et al. | 148/175 |
| 3,419,956 | 1/1969 | Kren et al. | 29/274 |
| 3,802,940 | 4/1974 | Villers et al. | 148/187 |

*Primary Examiner*—L. Dewayne Rutledge
*Assistant Examiner*—J. M. Davis
*Attorney, Agent, or Firm*—Alan H. MacPherson

[57] ABSTRACT

A method of aligning a wafer beneath a mask comprising forming a plurality of spaced-apart steps of predetermined length on a wafer such that the edges of the steps define a pattern of parallel lines, positioning the wafer beneath a mask having symmetrical openings spaced-apart by a distance substantially equal to the predetermined length such that the ends of the steps appear under the openings, illuminating the wafer with rays of light directed parallel to a plane perpendicular to the edges and incident upon the edges at an oblique angle relative to the top surface of the wafer, simultaneously detecting first diffraction scattered light emanating from one end of the steps and passing through one of the openings and second diffraction scattered light emanating from the other end of the steps and passing through the other of the openings, and moving the wafer relative to the mask until the first light has a predetermined relationship to the second light, and system therefor. In the preferred embodiment the steps form an alternating series of ridges and grooves. By remotely placing a second set of steps perpendicular to the direction of the first set, and a third set of steps parallel to the first set of steps, a complete and accurate alignment of the wafer beneath the mask is achieved. This method lends itself to aligning a unique semiconductor wafer that includes steps formed in a scribe channel separating a pair of adjacent chips.

19 Claims, 8 Drawing Figures

METHOD OF ALIGNING A WAFER BENEATH A MASK AND SYSTEM THEREFOR AND WAFER HAVING A UNIQUE ALIGNMENT PATTERN

BACKGROUND OF THE INVENTION

1. Field of the Invention

This invention relates generally to methods of aligning wafers relative to masks and more particularly to such a method in which a stepped top surface of the wafer is illuminated with rays of light whereby some of the light is scattered by diffraction off portions of the steps under a preselected mask, and in which the wafer is moved relative to the mask until the light detected from opposite ends of the steps bears a predetermined relationship.

2. Description of the Prior Art

Conventionally, integrated circuits are fabricated by successively and selectively forming and etching away layers of oxides and metals over a semiconductor substrate until the desired pattern is achieved. During the forming and etching steps, the semiconductor structures are aligned beneath a mask so as to define a pattern for the succeeding layer. The alignment of the masks with respect to the semiconductor substrates is very critical in fabricating an integrated circuit since the mask determines the position and dimensions of individual components formed in the layers. As higher performance circuits are required, circuit speeds and component densities have increased and accordingly, the dimensions of the individual components within integrated circuits have decreased. Consequently, the mask alignment requirements have become more demanding.

A commonly used mask alignment technique relies primarily on the skill of a technician-observer in using a microscope. More specifically, a square pattern is etched onto unused portions of the top surface of a semiconductor wafer at opposite sides thereof and a contact mask having a pair of windows therethrough is positioned over the wafer such that the square patterns are visible to an observer through a split image microscope. The observer then moves the wafer beneath the mask until he sees that the square patterns are substantially in the center of the corresponding windows. This technique is dependent upon the observer's vision, interpretation and judgment. Because of the small size of the wafer, it is unduly susceptible to operator error, especially when an operator is fatigued or has an eyestrain.

In a commercially available mask alignment and exposure system, a mask having a pair of spaced-apart window pattern which are on the order of 0.02 to 0.04 inches square, is positioned over designated portions of a semiconductor wafer. The designated portions are covered with a darkened pattern formed by a plurality of circles which are overlapping and very close to one another. Generally, the pattern is a square with 25 mil sides and provides a somewhat darkened image to the viewer. An alignment procedure similar to that described in the preceding paragraph is then followed wherein a contact mask having a pair of window patterns therethrough is positioned over the wafer and moved until the square patterns are centered in the window patterns, with the exception that different patterns are provided on the successive layers that are built up on the semiconductor chip prior to each successive masking step. The use of this alignment technique is subject to the disadvantage that it reduces the yield of the useful chips since the darkened patterns occupy usable portions of the semiconductor wafer.

In another mask alignment system, a microscope and a light detection unit are used to align a mask, which has four windows arranged around a periphery of an internal square, over a darkened square pattern. The inner periphery of the windows is formed such that the distance between opposite windows is less than the corresponding dimensions of the square pattern. Thus, the edges of the darkened pattern are visible in the windows. In one embodiment of this system the center-to-center distance between the sides of the windows is about 25 mils, the same distance as one side of the darkened pattern. In the light detection unit, the light received from one of the windows is measured and compared with that measured from the opposite window. For example, the light detected from the left window is compared with the light detected from the right window and the light detected from the upper window is compared with the light detected from the lower window. The mask is moved until the detected light in the two pair of opposite windows is equal. When the above relationship is achieved simultaneously in two widely separated regions on a wafer, the mask is in alignment over the wafer. An example of such a system is one manufactured by the Cobilt Division of the Computer Division Corporation. The system is designated as the Model CA-800 and incorporates a multi-element lens system in its light detection unit. One drawback to the use of such a system in aligning the mask over a semiconductor wafer is that it causes the yield of integrated circuits to decrease since the patterns occupy usable portion sof the semiconductor wafer. Another drawback to the use of such a system is that misalignment errors may result if the alignment patterns are not added to the masks in exactly the correct position with respect to the chip patterns on the masks.

Still another example of a method for aligning a wafer relative to a mask is found in U.S. Pat. No. 3,802,940, entitled "Enhanced Contrast Semiconductor Wafer Alignment Target and Method for Making Same," by Philippe Villers, Martin A. Allen and James M. Mulvaney, which issued Apr. 9, 1974. The patent teaches illuminating a target region with normally incident light which is either reflected or refracted away from the normal.

SUMMARY OF THE PRESENT INVENTION

In accordance with this invention, a method of aligning a wafer beneath a mask and system therefor is disclosed. The method includes forming a plurality of spaced-apart steps of predetermined length on a wafer such that the edges of the steps define a pattern of parallel lines, positioning the wafer beneath a mask having symmetrical openings spaced-apart by a distance substantially equal to the predetermined length such that the ends of the steps appear under the openings, illuminating the wafer with rays of light directed parallel to a plane perpendicular to the edges and incident upon the edges at an oblique angle relative to the top surface of the wafer, simultaneously detecting first diffraction scattered light emanating from one end of the steps and passing through one of the openings and second diffraction scattered light emanating from the other end of the steps and passing through the other of the openings, and moving the wafer relative to the mask until the first light has a predetermined relationship to the second light.

In accordance with other embodiments of this invention, a wafer which includes a pair of adjacent chips separated by a scribe channel beneath a mask and a method of aligning the wafer is disclosed. The method comprises forming a first plurality of spaced-apart steps of predetermined length on a pair of adjacent chips which extend outwardly from the opposed edges of a scribe channel such that the edges of the steps define a pattern of parallel lines that are spaced apart by the channel, positioning the wafer beneath a mask having a bar that has a width that is uniform and dimensionally intermediate the distance between the edges of the channel and the outermost extremities of the steps over the channel and the adjacent chips such that the ends of the steps are exposed, illuminating the adjacent chips with rays of light directed parallel to a plane perpendicular to the edges and incident upon the edges at an oblique angle relative to the top surface of the wafer, simultaneously detecting first diffraction scattered light emanating from one end of the steps and second diffraction scattered light emanating from the other end of the steps, and moving the wafer relative to the mask until the first light has a predetermined relationship to the second light.

An advantage of the method of this invention is that it provides extremely precise mask alignment.

Another advantage of this invention is that it is operable in both the automatic and manual modes.

Another advantage of this invention is that the alignment patterns may be part of each die pattern, thereby eliminating alignment errors which can result if masks are comprised of separate alignment patterns.

Still another advantage of this invention is that mask alignment is achieved which does not require the condemnation of usuable semiconductor real estate.

Other advantages will be apparent to those skilled in the art after having read the following detailed disclosure which makes reference to the several figures of the drawing.

IN THE DRAWING

DETAILED DESCRIPTION OF THE PREFERRED EMBODIMENT

The method of aligning a semiconductor wafer 10 beneath a mask 30 in accordance with the present invention utilizes the principle that a stepped surface illuminated with light scatters some of the incident light that strikes the edge of a step as a result of diffraction. It has been found that when a beam of light is positioned in a plane perpendicular to the edges of the steps and directed at an oblique angle to a target such that the incident light is perpendicular to the edges of the steps, the edges will diffract a well-defined pattern of light. Accordingly, the position of a target consisting of many closely spaced steps etched into a wafer is readily detected when illuminated by an intense beam of light.

Figures 1, 2:
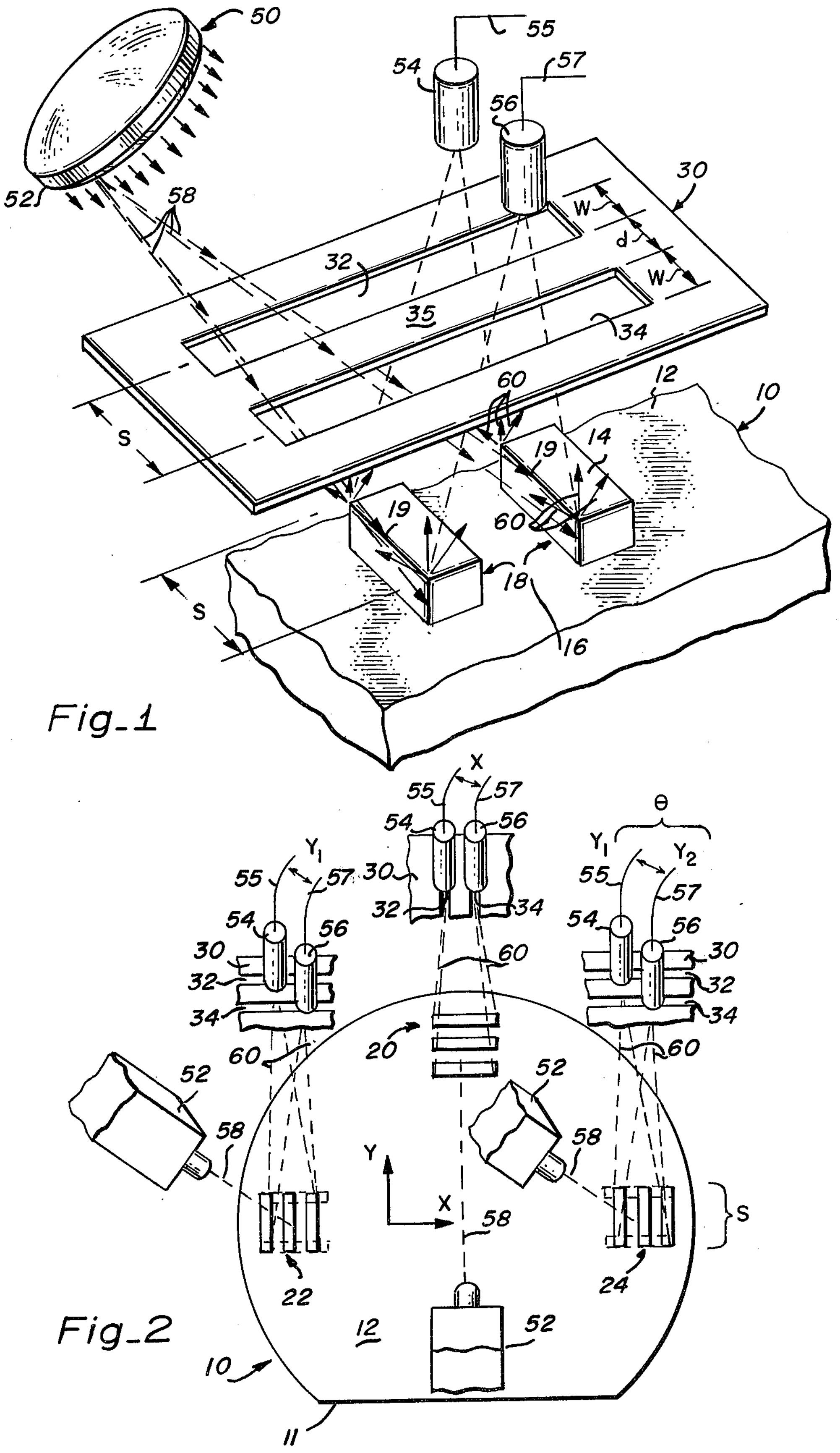
FIG. 1 is a diagrammatic perspective view of a system for aligning a semiconductor substrate beneath a mask in accordance with a method of the present invention.
FIG. 2 illustrates the top surface of a semiconductor substrate having three patterns of steps formed thereon and the relative positioning of light sources and detectors in accordance with the present invention.

Referring to FIG. 1 of the drawing, a diagrammatic view of a system for aligning the semiconductor wafer 10 beneath the mask 30 is shown. The semiconductor wafer 10 is preferably fabricated from silicon, although it is evident to those skilled in the art that other semiconductor or thin film materials may be used. A portion of the top surface 12 of the wafer 10 is comprised of a series of alternating ridges 14 and valleys 16 which define a plurality of steps 18. For convenience the steps 18 are shown to be substantially rectangular in end view, although it should be recognized that any step having a shape that scatters light by diffraction as described herein may be used in accordance with this invention. In practice the surface interconnecting the ridge 14 and the adjacent valley 16 generally forms an angle relative to the normal. The steps 18 are preferably formed in the scribe channel regions of the top surface 12 and thus consume no useful die area. The adjacent surfaces of the steps 18 provide edges 19 which are of substantially equal length, S, and define a pattern of parallel lines.

The mask 30 includes a pair of rectangular windows 32 and 34, sometimes referred to as apertures or openings, which are separated by a central bar 35 having a uniform width, d, that is less than S, the length of the edges 19. Preferably, the windows are symmetrical and are separated by a centerline-to-centerline distance which is substantially equal to the length S. The width of the windows 32 and 34 is denoted by the letter W and controls the sensitivity of the system to detecting the diffracted light. From the above, the relationship between the mask and the steps is expressed by the formula $d \leq S \leq d + 2W$. Since the separation between the inner edge of the windows is less than the length S of the edges 19, the tips of the steps are exposed when the wafer 10 is aligned beneath the mask 30. Hence, the separation of the windows controls the distance over which a proper error signal is obtained during the alignment process. The mask 30 is preferably fabricated from a glass with opaque regions and is associated with an alignment station (not shown).

The system, generally designated by the numeral 50, comprises a light source 52 and a pair of light detectors 54 and 56, such as, for example, a pair of photodiodes. A pair of electrical conductors 55 and 57 are connected to the detectors 54 and 56, respectively, for conducting electrical signals from the detectors to output circuitry (not shown). The light source 52 is adjustably positioned so as to illuminate the steps 18 with a beam of intense incident light indicated by numerals 58. The incident light beam 58 forms an oblique angle with the steps 18 and is in a plane perpendicular thereto. Accordingly, since the incident light beam 58 lies in a plane perpendicular to the edges 19 of the steps 18, each edge 19 of the ridge 14 in the top surface 12 scatters some of the incident light by diffraction. The light scattered by diffraction is generally designated by the numerals 60 in FIG. 1. Although only a small fraction of the incident light is scattered by the edges 19, the rest of the light being transmitted, absorbed, or reflected specularly, nevertheless, the scattered light forms a very well defined, bright target. The detectors 54 and 56 are arranged above the windows 32 and 34, respectively, and focused on the windows 32 and 34 so as to detect a portion of the light scattered by diffraction which is transmitted through the windows 32 and 34.

The amount of light which is scattered by the ends of any step 18 and consequently detected by the detectors 54 and 56 changes very quickly as the wafer 10 is moved laterally with respect to the mask 30. In fact, as will be subsequently described, the difference in the light detected by the detectors 54 and 56 is found to be proportional to the misalignment between the target on the wafer 10 and the bar 35 on the mask 30. Thus, by moving the wafer 10 relative to the mask 30, the detected light from the ends of the steps 18 may be varied. When the light detected by each detector 54 and 56 has a predetermined relationship, the mask 30 is aligned in one direction over the wafer 10.

Referring now to FIG. 2, the top surface 12 of a semiconductor wafer 10 is illustrated in plan view. The surface 12 comprises three patterns of steps 20, 22 and 24. The steps in each of the patterns are formed such that the edges of the steps are equal and define a pattern of parallel lines. Each of the patterns of steps 20, 22 and 24 are formed in different regions of the wafer, preferably in the scribe channel regions, by selectively etching the silicon wafer.

The wafer 10 includes a flat alignment surface 11 extending in a direction parallel to the X-axis which serves as a reference surface in forming the steps 20, 22 and 24 on the surface 12. The steps 20 are arranged with the edges of the steps disposed parallel to the alignment surface 11 and the X-axis. The steps 22 and 24 are arranged perpendicular to the steps 20 near opposite sides of the wafer 10 such that the outer extremities of the steps of the patterns 22 and 24 lie along a pair of parallel lines separated by the distance S.

Each of the patterns of steps 20, 22 and 24 is illuminated with intense incident light 58 from light sources 52 which are positioned at oblique angles to the surface 12 in planes perpendicular to the respective edges of the steps. As previously discussed, a portion of the light 60 that is scattered by diffraction off the edges of the ends of the edges of the steps 20, 22 and 24 passes through the corresponding windows 32 and 34 in the respective masks 30 and is detected by the detectors 54 and 56. The detectors 54 and 56, in turn, develop an electrical output signal on each of the respective conductors 55 and 57 which is representative of the light scattered from each end of the steps. It should be noted that the masks 30 may be either projection masks, which are disposed at some distance from the top surface 12 of the wafer 10, or contact masks, which are disposed in contact with, or slightly above, the top surface of the wafer. The electrical output signal developed on the conductors 55 and 57 provides an indication of the alignment of the mask 30 with respect to an axis that is parallel to the steps of the respective patterns. For example, the output signal associated with the pattern of steps 20 provides an indication of the misalignment along the X-axis so as to eliminate mask offsets in the X direction. The output signal $Y_1$ associated with the pattern of steps 22 provides an indication of the misalignment along the Y-axis so as to eliminate mask offsets in the Y direction. The output signal $Y_2$ associated with the pattern of steps 24 also provides an indication of the misalignment along the Y-axis so as to eliminate mask offsets in the Y direction. By appropriately rotating the mask such that null signals are indicated by the $Y_1$ and $Y_2$ output signals, angular misalignment, designated by the symbol $\theta$; is eliminated.

Normally the patterns of steps 22 and 24 are spaced far apart from one another to achieve accurate angular alignment. The pattern of steps 20 may be near the middle of the wafer 10. It should be noted that if the patterns of steps 20, 22 and 24 are formed close to the outer perimeter of the wafer, then no usable die area is occupied. Furthermore, the target patterns of steps 20, 22 and 24 may be located quite close to integrated circuit components on the wafer without causing any deleterious effects in alignment accuracy since the amount of scattered light from any pattern decreases rapidly as a function of the rotation of the pattern with respect to the plane of the incident light. Because of this, nearby circuit patterns in the top surface 12 do not cause any appreciable error in the accuracy of alignment.

Figure 3:
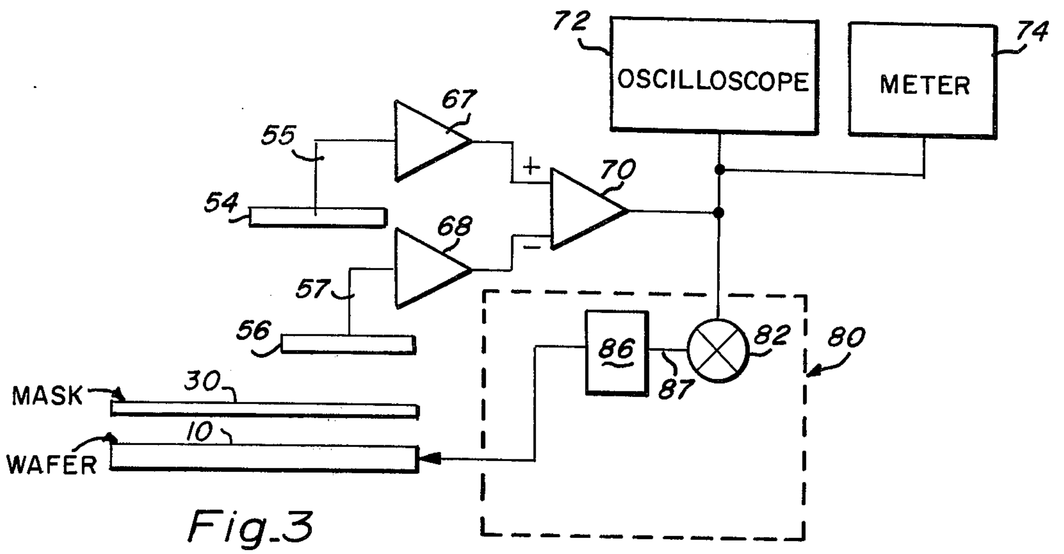
FIG. 3 is a schematic diagram of an apparatus used for automatically aligning a wafer beneath a mask in accordance with the present invention.

Referring to FIG. 3, a schematic diagram of an apparatus for automatically aligning the mask over the semiconductor wafer is shown. The apparatus includes the pair of detectors 54 and 56 which are respectively connected through the pair of conductors 55 and 57 to a pair of amplifiers 67 and 68 for amplifying the electrical output signals produced by each of the detectors 54 and 56. A differential amplifier 70 is connected between a pair of output terminals of the respective amplifiers 67 and 68. The differential amplifier 70 is responsive to each of the amplified detected signals and is operative to provide an error, or output, signal that represents the difference in the quantity of light detected by the detectors 54 and 56. The error signal provides an indication of the misalignment of the mask 30 with respect to the wafer 10. The error signal is applied to an oscilloscope 72, to a meter 74 and to the input of an electromechanical positioning means, generally designated by the numeral 80. Accordingly, the screen of the oscilloscope 72 provides a visual indication of the instantaneous misalignment between the wafer 10 and the mask 30, and the meter 74, which is preferably a direct current (DC) meter, provides an indication of the average value of the misalignment. The electromechanical positioning means 80 includes a sensing amplifier 82 and a mechanical wafer-positioning means 86 which are serially connected by an electrical conductor 87. The sensing amplifier 82 is responsive to the error signal developed by the differential amplifier 70 and provides a driving signal on the conductor 87 to the mechanical wafter-positioning means 86 which moves the wafer relative to the mask until the error signal is nulled.

Figure 4:
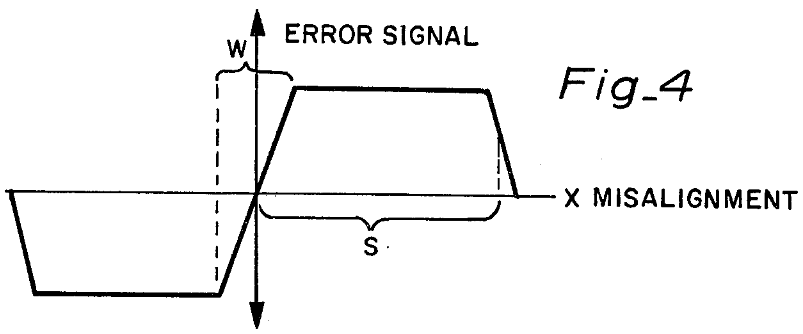
FIG. 4 is a graph illustrating the output voltage produced by detecting the scattered light versus the misalignment of the mask in one direction.

Referring to FIG. 4, the error or output voltage of the differential amplifier 70 is illustrated as a function of the lateral displacement of the mask relative to the X-axis. It should be noted that since the width of the bar 35, *d*, is less than the length of the step, S, when one of the windows 32 or 34 is disposed over a width W of the steps the other window will not be positioned over any portion of the corresponding steps. Consequently, in this relative disposition, the magnitude of the error signal is maximum (and at a substantially constant level) since the entire error signal is due solely to light detected by one of the detectors 54 and 56. The polarity of the signal will be positive if the detector 54 is over the steps and will be negative if the detector 56 is over the steps. When each of the photodiodes 54 and 56 detects scattered light through the respective windows 32 and 34, the error signal varies linearly between the positive and negative maximums. A null error signal indicates that the wafer 10 is in alignment beneath the mask 30. It should be realized that by narrowing the width W of the windows 32 and 34, less light will be provided to the detection system and consequently, the signal-to-noise ratio will be decreased. At the same time, the system will provide an increased positional sensitivity, because the linear region is narrowed.

In the preferred mask configuration, the width of each window 32 and 34 is fifty microns, and the length of each window is equal to the product of an integer N multiplied by the separation between leading edges of adjacent steps. With this dimensional relationship, N steps are always illuminated. Since a constant number of steps is illuminated the system is insensitive to nonlinearities in the characteristics of the amplifiers 67 and 68 and to a lack of common mode rejection in the differential amplifier 70. Such nonlinearities and lack of common mode rejection characteristics could create errors if, for example, six steps were illuminated at some times, and seven steps at other times. Moreover, the integral relationship prevents interference arising from light intensity fluctuations due to motion of the wafer in the Y-direction when aligning the wafer along the X-axis.

In the preferred embodiment of the system 50, the source 52 is a gas laser which emits a beam of coherent red light at an angle of approximately 45° relative to the normal to the top surface 12 and which has a power of 2 milliwatts. The wavelength of the light emitted is substantially of a single wavelength which is preferably about one-half the magnitude of the height of the steps. It should be noted that red light does not expose photoresist. Alternatively, a fiber optic bundle may be used to direct light from the laser through a lens (not shown) which can be accurately focused to provide the necessary incident light on the steps. The lens may be a simple lens of short focal length, i.e., 6 mm. The detectors 54 and 56 are preferably a pair of matched photodiodes and the amplifiers 67 and 68 are DC amplifiers. It should be realized that light pipes, light chopping apparatus and synchronous detection circuits could be implemented in the detection system in arrangements well known to those skilled in the art.

Figure 5:
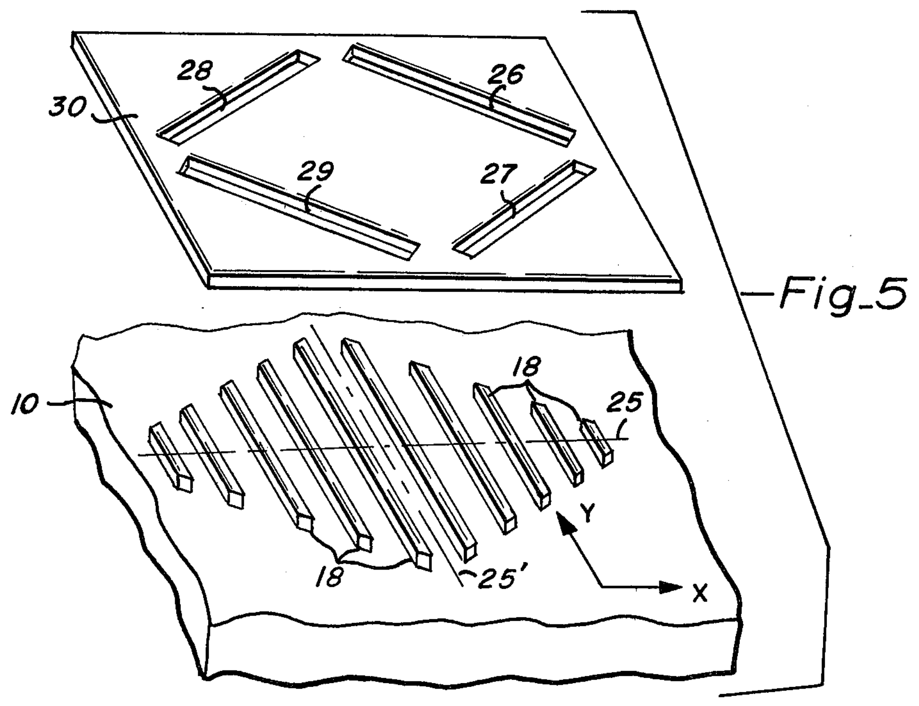
FIG. 5 is an exploded perspective view of a projection mask and a semiconductor substrate having a stepped top surface formed in a different geometric pattern from that of FIG. 1.

Referring to FIG. 5, another embodiment of a semiconductor substrate and its corresponding mask is illustrated. The wafer 10 has a pattern of closely-spaced parallel steps 18 formed on its top surface which are symmetrical about a center line 25 and about a line 25' perpendicular thereto. The length of the steps 18 progressively increases as the distance from the end steps increases such that the tips of the steps lie on the perimeter of a square. The mask 30 includes a plurality of windows 26, 27, 28 and 29 which are arranged in a substantially square pattern, with the center-to-center distance between opposite windows 26 and 27, and 28 and 29 being equal to the dimension of the square defined by the tips of the steps. The window pattern is suited for aligning the projection mask in the X and Y directions such that the alignment is accomplished with only a single target. However, it should be noted that this target is not suitable for alignment with contact masks because the target cannot be illuminated with light incident at an angle of 45° from the axis of the windows of the mask. When contact masks are required, the pattern illustrated in FIGS. 1 and 2 should be utilized, since as previously described, that target provides ridges which are perpendicular to the axes of the windows.

Figure 6:
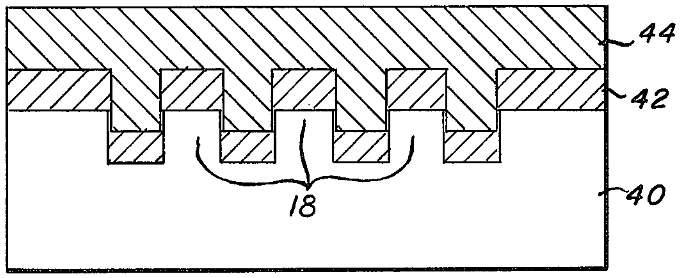
FIG. 6 is a cross-sectional view of a structure that may be aligned beneath a mask in accordance with the present invention.

Referring to FIG. 6, another embodiment of a light scattering surface of a semiconductor structure is illustrated. The semiconductor structure includes a silicon substrate 40. The top surface of the substrate 40 is selectively etched with an appropriate first mask (not shown) to provide a series of parallel steps 18 on the top surface of the substrate. An insulating layer 42, preferably of silicon dioxide, is formed on the substrate such as by well-known thermal oxidation techniques. The insulating layer 42 is transparent to most light sources and thus, as a media, does not appreciably change the illumination or diffraction pattern of light passing therethrough. A photoresist layer 44 is deposited by conventional deposition techniques for subsequent development, using photolithographic masking and etching techniques. For convenience, both the insulating layer 42 and the photoresist layer 44 are illustrated as having respective boundary surfaces which are normal to the horizontal, although, as previously discussed, in practice the surfaces are generally angled relative thereto. The photoresist layer 44 is transparent to certain light sources. It has been found that the underlying silicon steps diffract substantially the same portion of incident light as do the steps of the structure of FIG. 1 which are not covered by silicon dioxide and photoresist. However, care must be taken during each illuminating step so as to properly expose the photoresist. For example, when layer 44 is comprised of negative photoresist, it is exposed in a separate masking step. When positive photoresist is used, the photoresist is exposed through the mask windows over the ends of the steps which result in a slight shortening of the width of the steps. However, it has been found that the shortening does not produce any noticable alignment problems. In addition, the frequency of the light source should be selected such that the emitted light does not expose the photoresist. Thus, even in multi-layer semiconductor structures, the scattering incident light is primarily effected by the silicon-silicon dioxide interface.

Figure 7:
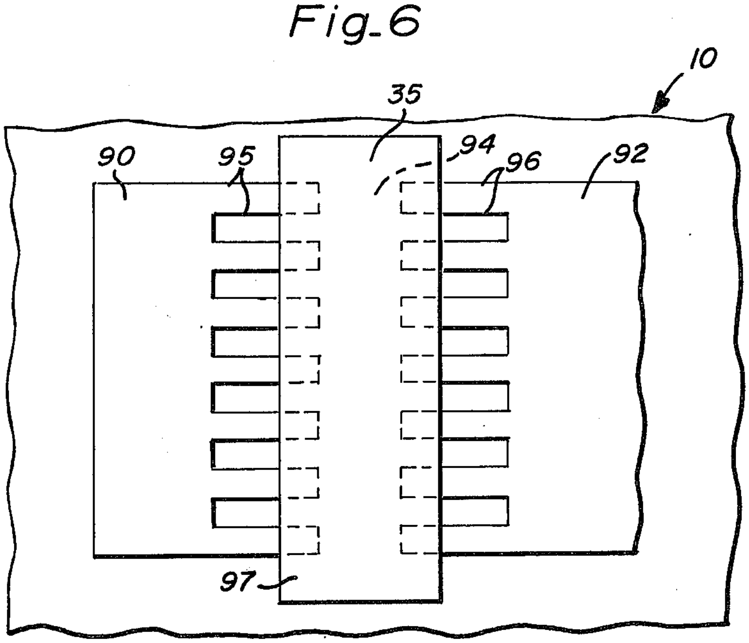
FIG. 7 is a plan view of a semiconductor substrate and mask in which the substrate is comprised of adjacent dies having serrated edges.

One of the features of the present invention is that mask alignment can be achieved with on-chip patterns that require no useful area on a semiconductor chip. Referring to FIG. 7, adjacent chip patterns 90 and 92 on a semiconductor wafer 10 are separated by a serrated scribe channel 94 which is laid down by the second mask during the fabrication of the integrated circuits. The serrated edges of the channel 94 provide a pattern of spaced-apart parallel steps 95 and 96 which dovetail into the corresponding edges of the chips 90 and 92. The mask 97 for use with this pattern would be similar to that illustrated in FIG. 1 and which has an opaque scribe-line bar 35 centrally disposed therein which separates windows (not shown). The width of the bar 35 is uniform and slightly greater than the distance between the edges of the adjacent chips and defines the inner edges of the "windows." The outer edges of the windows are defined by the pattern-sensing characteristics of the corresponding photodiodes (not shown). In order to insure that each of the photodiodes detects the same field of view, the photodiodes are carefully chosen to have matched characteristics. Perfect alignment of the opaque bar 35 of the mask 97 is illustrated in FIG. 7 such that the bar 35 covers the chip patterns 90 and 92 symmetrically and exposes the outer portions of the steps 95 and 96. Consequently, equal amounts of the chip pattern appear on each side of the bar 35. As in the prior embodiments, such as is shown in FIGS. 2 and 3, a source 52 of light, preferably a laser that emits a single frequency light beam, is positioned in a plane perpendicular to the edges of the steps and energized so as to illuminate the top surface of the wafer 10 with rays of light incident at an oblique angle after passing through the mask 97. The matched pair of photodiodes 54 and 56 is focused so that one photodiode detects the diffraction scattered light from the outer portions of the steps exposed beyond each of the respective ends of the bar 35. The resultant misalignment signal is similar to that illustrated in FIG. 4. To align the wafer 10 beneath the mask 97 the wafer 10 is moved until the light simultaneously is detected by the photodiodes 54 and 56 has a predetermined relationship.

Figure 8:
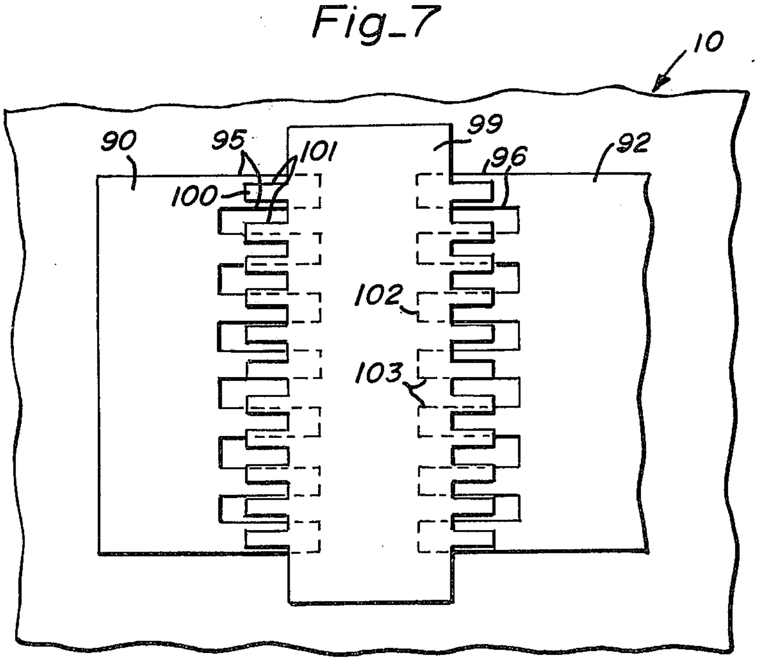
FIG. 8 is a plan view of a mask pattern which is used to provide a stepped pattern under a metal layer.

It should be recognized that the serrated scribe channel pattern laid down by the second mask during the fabrication of integrated circuits is not visible through a metalization layer. To circumvent this limitation, the pattern illustrated in FIG. 8 is laid down by a later mask and is used to provide a target for aligning the metalization mask. The pattern of a mask 99 is superposed directly over the alignment pattern of the serrated scribe channel laid down by the second mask. The mask pattern 100 is illustrated by the solid lines and is seen to include serrations 101 and the adjacent die patterns beneath the mask 99 are illustrated by the dashed lines 102 and include serrations 103.

It should be recognized that the serrations 101 on the mask 99 must have different spacings from those on the wafer 10 in order for the serrations on the wafer to be visible beneath those of the mask. If, however, the spacings between the serrations on the mask and on the wafer are integrally related then some of the serrations on the wafer would still be covered by the mask. Consequently, it is preferable to make the number of serrations on the mask and on the wafer mutually prime numbers. As illustrated, the scribe channel defines seven serrations in the underlying wafer 10 and the mask 99 defines 11 serrations 101, 7 and 11 being mutually prime numbers. With this prime number relationship cross-modulation interference, which is the appearance of an X-direction misalignment due to a Y-direction misalignment, is prevented.

From the above it will be seen that there has been provided a method for aligning a wafer beneath a mask in a manner which does not consume any of the useful semiconductor area and, in one embodiment, which uses on-chip targets for electronic mask alignment which fulfills all of the advantages set forth above.

While there has been described what is at present considered to be the preferred embodiments, it will be understood that various modifications may be made therein, and it is intended to cover in the appended claims all such modifications as fall within the true spirit and scope of the invention.

What is claimed is:

1. A method of aligning a wafer beneath a mask comprising:

forming a first plurality of spaced-apart steps of predetermined length on a wafer such that the edges of said steps define a pattern of parallel lines;

positioning the wafer beneath a mask having a first set of symmetrical openings spaced-apart by a distance substantially equal to said predetermined length such that the ends of said steps appear under said openings;

illuminating the wafer with rays of light directed parallel to a plane perpendicular to said edges and incident upon said edges at an oblique angle relative to the top surface of the wafer;

simultaneously detecting first diffraction scattered light emanating from one end of said steps and passing through one of said openings and second diffraction scattered light emanating from the other end of said steps and passing through the other of said openings; and moving the wafer relative to the mask until said first light has a predetermined relationship to said second light.

2. A method of aligning a wafer beneath a mask as recited in claim 1 wherein said rays of light are collimated and substantially of single wavelength, and wherein said steps are formed so as to have a height that is of the same order of magnitude as said wavelength.

3. A method of aligning a wafer beneath a mask as recited in claim 2 wherein said steps are formed so as to have a height that is twice the magnitude of said wavelength.

4. A method of aligning a wafer beneath a mask as recited in claim 1 wherein said steps are formed so as to correspond to an alternating series of ridges and grooves.

5. A method of aligning a wafer beneath a mask as recited in claim 1 wherein the mask has a second set of symmetrical openings spaced apart by a distance substantially equal to said predetermined length and arranged substantially parallel to said first set and further including forming a second plurality of steps on the wafer such that the edges of said second steps define a pattern of parallel lines that are spaced apart from and parallel to said parallel lines defined by said first steps, positioning the wafer beneath the mask such that the ends of said second steps appear under said second set of openings; illuminating the wafer with rays of light directed parallel to a plane perpendicular to the edges of said second steps and incident upon said edges at an oblique angle relative to the top surface of the wafer; simultaneously detecting third diffraction scattered light emanating from one of said second steps and passing through one of said second set of openings and fourth diffraction scattered light emanating from the other end of said second steps and passing through the other of said second set of openings; and moving the wafer relative to the mask until said third light has a predetermined relationship to said fourth light, thereby to prevent angular misalignment of the wafer beneath the mask.

6. A method of aligning a wafer beneath a mask as recited in claim 1 wherein the mask has a third set of symmetrical openings spaced apart by a distance substantially equal to said predetermined length and arranged substantially perpendicular to said first set and further including forming a third plurality of steps on the wafer such that the edges of said third steps define a pattern of parallel lines that are perpendicular to said parallel lines defined by said first step, positioning the wafer beneath the mask such that the ends of said third steps appear under said third set of openings; illuminating the wafer with rays of light directed parallel to a plane perpendicular to the edges of said third steps and incident upon said edges at an oblique angle relative to the top surface of the wafer; simultaneously detecting fifth diffraction scattered light emanating from one end of said third steps and passing through one of said third set of openings and sixth diffraction scattered light emanating from the other end of said third steps and passing through the other of said third set of openings; and moving the wafer relative to the mask until said fifth light has a predetermined relationship to said sixth light, thereby to prevent misalignment of the wafer beneath the mask in a direction normal to that defined by said edges of said third steps.

7. A method of aligning a wafer beneath a mask as recited in claim 5 wherein the mask has a third set of symmetrical openings spaced apart by a distance substantially equal to said predetermined length and arranged substantially perpendicular to said first set and further including forming a third plurality of steps on the wafer such that the edges of said third steps define a pattern of parallel lines that are perpendicular to said parallel lines defined by said first step, positioning the wafer beneath the mask such that the ends of said third steps appear under said third set of openings; illuminating the wafer with rays of light directed parallel to a plane perpendicular to the edges of said third steps and incident upon said edges at an oblique angle relative to the top surface of the wafer; simultaneously detecting fifth diffraction scattered light emanating from one end of said third steps and passing through one of said third set of openings and sixth diffraction scattered light emanating from the other end of said third steps and passing through the other of said third set of openings; and moving the wafer relative to the mask until said fifth light has a predetermined relationship to said sixth light, thereby to prevent misalignment of the wafer beneath the mask in a direction normal to that defined by said edges of said third steps.

8. A method of aligning a wafer beneath a mask as recited in claim 1 wherein the step of simultaneously detecting first diffraction scattered light includes focusing a pair of photodiodes on said first set of spaced-apart openings above said ends of said steps.

9. A method of aligning a wafer beneath a mask as recited in claim 1 and after simultaneously detecting first diffraction scattered light, differentially amplifying respective signals derived from said first and second light so as to provide an indication of the misalignment of the wafer with respect to the mask.

10. A method of aligning a wafer beneath a mask comprising:

forming a first plurality of spaced-apart steps of predetermined length on a wafer such that the edges of said steps define a pattern of parallel lines;

providing a mask having first and second openings defining centers spaced apart by a distance substantially equal to said predetermined length;

positioning the wafer beneath said mask with the respective ends of said steps lying beneath said first and second openings;

illuminating the wafer with rays of light directed parallel to a plane perpendicular to said edges and incident upon said edges at an oblique angle relative to the top surface of the wafer;

simultaneously detecting first diffraction scattered light emanating from one end of said steps and passing through said first opening and second diffraction scattered light emanating from the other end of said steps and passing through said second opening; and moving the wafer relative to said mask until said first light has a predetermined relationship to said second light.

11. A method of aligning a wafer including a pair of adjacent chips that are separated by a scribe channel beneath a mask comprising the steps of:

forming a first plurality of spaced-apart steps of predetermined length on a pair of adjacent chips which extend outwardly from the opposed edges of a scribe channel such that the edges of said steps define a pattern of parallel lines that are spaced apart by said channel;

positioning the wafer beneath a mask having a bar that has a width that is uniform and dimensionally intermediate the distance between said edges of said channel and the outermost extremities of said steps over said channel and said adjacent chips such that the ends of said steps are exposed;

illuminating the adjacent chips with rays of light directed parallel to a plane perpendicular to said edges and incident upon said edges at an oblique angle relative to the top surface of the wafer;

simultaneously detecting first diffraction scattered light emanating from one end of said steps and second diffraction scattered light emanating from the other end of said steps; and moving the wafer relative to the mask until said first light has a predetermined relationship to said second light.

12. A method of aligning a wafer including a pair of adjacent chips that are separated by a scribe channel beneath a mask as recited in claim 11 wherein said rays of light are collimated and substantially of a single wavelength, and wherein said steps are formed so as to have a height that is of the same order of magnitude as said wavelength.

13. A method of aligning a wafer including a pair of adjacent chips that are separated by a scribe channel as recited in claim 12 wherein said steps are formed so as to have a height that is twice the magnitude of said wavelength.

14. A method of aligning a wafer including a pair of adjacent chips that are separated by a scribe channel as recited in claim 11 wherein said steps are formed so as to correspond to an alternating series of ridges and grooves.

15. A method of aligning a wafer including a pair of adjacent chips that are separated by a scribe channel as recited in claim 11 wherein simultaneously detecting first scattered light includes focusing a pair of substantially matched photodiodes, each defining a detection window, on said exposed ends of said steps such that the inner edge of each said detection window is aligned with the respective outer edges of said bar.

16. A method of aligning a wafer including a pair of adjacent chips that are separated by a scribe channel as recited in claim 15 and further including differentially amplifying said first and second light so as to provide an error signal indicative of the misalignment of the wafer with respect to the mask.

17. A method of aligning a wafer including a pair of adjacent chips that are separated by a scribe channel as recited in claim 16 and after the step of differentially amplifying said first and second light, applying said error signal to an electromechanical wafer positioning means which is operative to move the wafer into alignment with the mask.

18. A method of aligning a wafer including a pair of adjacent chips that are separated by a scribe channel as recited in claim 11 and including forming a second mask over said scribe channel, said second mask including a bar portion which defines a number of serrations which number is mutually prime to the number of said plurality of steps, illuminating the adjacent chips with rays of light such that some of said light is scattered by diffraction off the exposed ends of said underlying first plurality of steps, simultaneously detecting third and fourth diffraction scattered light emanating from the respective ends of said steps, and moving the wafer relative to the second mask until said third light has a predetermined relationship to said fourth light.

19. A system for aligning a wafer beneath a mask comprising:

a wafer including a top surface having a plurality of scribe channels formed therein, at least one of said scribe channels formed to define a plurality of spaced-apart steps of a predetermined length such that the edges of said steps define a pattern of parallel lines;

a mask having a set of symmetrical openings spaced apart by a distance substantially equal to said predetermined length, said mask being positioned above said top surface such that the ends of said steps appear under said openings;

means for illuminating the wafer with rays of light directed parallel to a plane perpendicular to said edges and incident upon said edges at an oblique angle relative to said top surface;

means for simultaneously detecting first diffraction scattered light emanating from one end of said steps and passing through one of said openings and second diffraction scattered light emanating from the other end of said steps and passing through the other of said openings; and means for moving said wafer relative to said mask until said first light has a predetermined relationship to said second light.

* * * * *